(12) United States Patent
Triece et al.

(10) Patent No.: US 6,463,544 B2
(45) Date of Patent: *Oct. 8, 2002

(54) METHOD FOR POWERING DOWN UNUSED CONFIGURATION BITS TO MINIMIZE POWER CONSUMPTION

(75) Inventors: Joseph W. Triece; Rodney Drake, both of Phoenix; Igor Wojewoda, Tempe, all of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/850,214

(22) Filed: May 7, 2001

(65) Prior Publication Data

US 2001/0018750 A1 Aug. 30, 2001

Related U.S. Application Data

(63) Continuation of application No. 09/232,053, filed on Jan. 15, 1999, now Pat. No. 6,230,275.

(51) Int. Cl.[7] .................................................. G06F 1/26
(52) U.S. Cl. ....................................... 713/324; 365/227
(58) Field of Search ................................. 713/320, 300, 713/323, 324, 330, 340; 365/226, 227, 228, 229, 225.7

(56) References Cited

U.S. PATENT DOCUMENTS

| | | | |
|---|---|---|---|
| 4,889,669 A | 12/1989 | Suzuki | 264/45.9 |
| 5,663,902 A | 9/1997 | Bennett et al. | 365/96 |
| 5,712,003 A | 1/1998 | Suenaga et al. | 428/31 |
| 5,765,002 A | 6/1998 | Garner et al. | 395/750.01 |
| 5,790,469 A | 8/1998 | Wong | 365/226 |
| 5,898,630 A | 4/1999 | Madurawe | 365/203 |
| 6,018,488 A | 1/2000 | Mishima et al. | 365/225.7 |
| 6,088,284 A | 7/2000 | Lee et al. | 365/230.03 |
| 6,101,143 A | 8/2000 | Ghia | 365/227 |
| 6,230,275 B1 * | 5/2001 | Triece et al. | 713/320 |

* cited by examiner

Primary Examiner—Peter Wong
Assistant Examiner—X. Chung-Trans
(74) Attorney, Agent, or Firm—Baker Botts L.L.P.

(57) ABSTRACT

A system for powering down configuration circuits to minimize power consumption has at least one first configuration circuit for configuring a peripheral module. A second configuration circuit is coupled to the peripheral module and to the at least one first configuration circuit. The second configuration circuit is used for enabling and disabling the peripheral module. The second configuration circuit is further used to power down the at least one first configuration circuit to minimize current consumption of the at least one first configuration circuit when the peripheral module is disabled.

21 Claims, 4 Drawing Sheets

METHOD FOR POWERING DOWN UNUSED CONFIGURATION BITS TO MINIMIZE POWER CONSUMPTION

This application is a continuation of U.S. patent application Ser. No. 09/232,053, filed on Jan. 15, 1999 now U.S. Pat. No. 6,230,275.

BACKGROUND OF THE INVENTION

1. Field of the Invention

This invention relates generally to configurations bits and, more specifically, to a circuit wherein unused configuration bits may be powered down to minimize power consumption without having to program the unused configuration bits.

2. Description of the Prior Art

Most processors have one or more peripheral modules. These peripheral modules will generally have a primary configuration bit. The primary configuration bits are used to enable/disable the different peripheral modules. In many cases, the peripheral modules will further have one or more secondary configuration bits. These secondary configuration bits are used to "configure" (i.e., calibrate) the peripheral modules. The secondary configuration bits are used to fine tune elements within the peripheral modules such as resistors, current sources, and other like elements. In many applications, the primary and secondary configuration bits are programmable fuses such as EPROM and EEPROM fuses.

One limitation of configuration bits is that when the configuration bits are unprogrammed, they may draw current. A peripheral module is disabled by programming the corresponding enable/disable configuration bit. When this is done, the corresponding configuration bits that are used to calibrate the peripheral module are no longer necessary. However, if left unprogrammed, the unprogrammed configuration bits will continue to draw current.

Therefore, a need existed to provide a circuit for powering down configuration bits. The circuit would allow any unused configuration bits to be powered down to minimize current consumption when the corresponding peripheral modules are not in use. The circuit would further allow any unused configuration bits to be powered down to minimize current consumption without having to program the unused configuration bits.

SUMMARY OF THE INVENTION

In accordance with one embodiment of the present invention, it is an object of this invention to provide a circuit for powering down configuration bits.

It is another object of the present invention to provide a circuit that would allow any unused configuration bits to be powered down to minimize current consumption when the corresponding peripheral module is not in use.

It is still another object of the present invention to provide a circuit that would allow any unused configuration bits to be powered down to minimize current consumption without having to program the unused configuration bits.

BRIEF DESCRIPTION OF THE PREFERRED EMBODIMENTS

In accordance with one embodiment of the present invention, a system for powering down configuration circuits to minimize power consumption is disclosed. The system has at least one first configuration circuit for configuring a peripheral module. A storage element is coupled to the peripheral module and to the at least one first configuration circuit. The storage element is used for enabling and disabling the peripheral module. The storage element is further used to power down the at least one first configuration circuit to minimize current consumption of the at least one first configuration circuit when the peripheral module is disabled. In one embodiment of the present invention, the storage element is a second configuration circuit.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
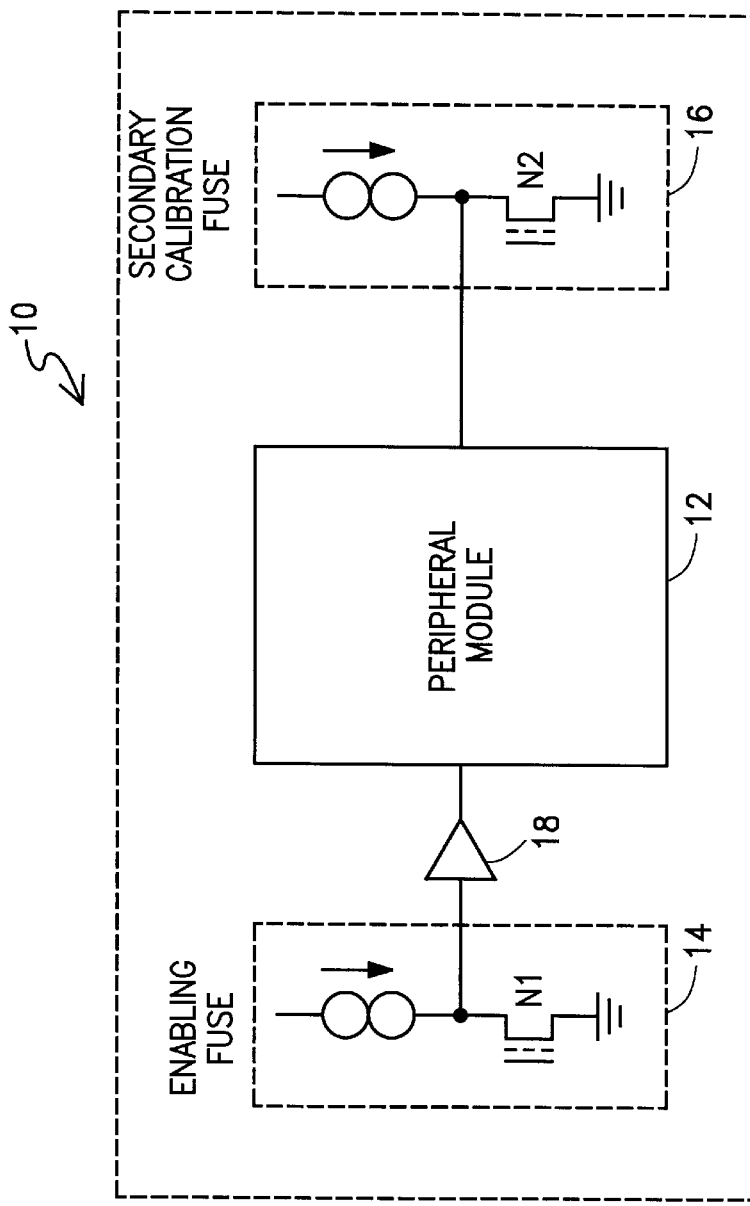
FIG. 1 is a prior art electrical schematic of a peripheral module and its associated configuration fuses.

Referring to FIG. 1, a prior art system 10 is shown. The system 10 has a peripheral module 12. The peripheral module 12 is coupled to a storage element 14. The storage element 14 generates an output signal which is sent through a buffer 18. The output signal from the storage element 14 is used to enable and disable the peripheral module 12. In the embodiment depicted in FIG. 1, the storage element 14 is a programmable fuse. The peripheral module 12 may further have one or more calibration bits 16. The calibration bits 16 are used to calibrate or fine tune elements within the peripheral module 12. In the embodiment depicted in FIG. 1, the calibration bits 16 are also programmable fuses.

The peripheral module 12 is disabled by programming the storage element 14. When the peripheral module 12 is disabled, the calibration bits 16 are no longer required. However, when left unprogrammed, the calibration bits 16 will continue to draw current.

Figure 2:
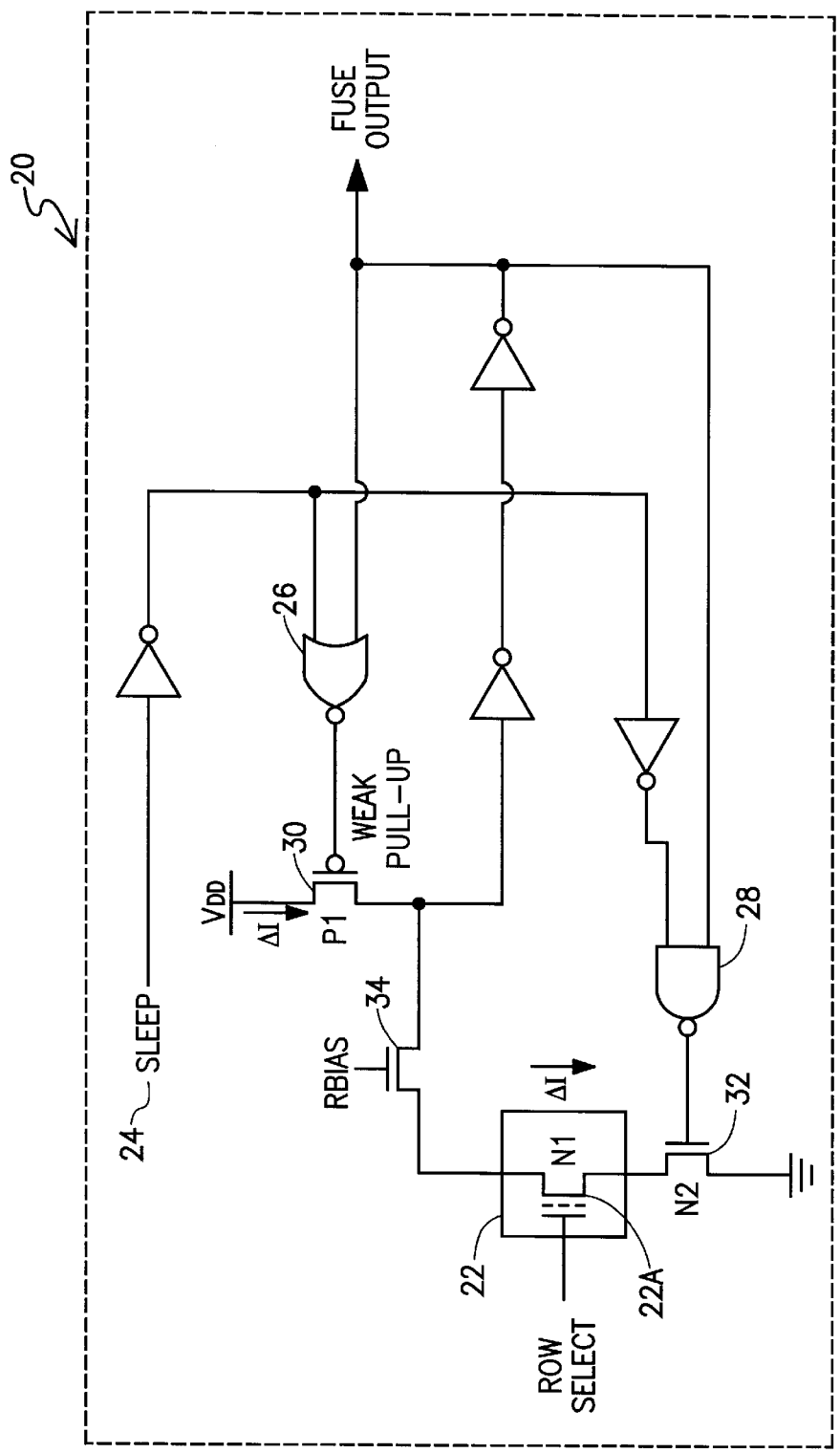
FIG. 2 is a detailed electrical schematic of a configuration fuse.

Referring to FIG. 2, a configuration fuse 20 is shown. When the memory cell 22 of the configuration fuse 20 is unprogrammed, the threshold voltage $V_t$ of the memory cell 22 is below that of the gate voltage (i.e., Rowselect voltage). Thus, the transistor 22A of the memory cell 22 is allowed to conduct current. If the Sleep signal 24 is inactive (i.e., Sleep ='0'), the NOR gate 26 will output a low signal thereby allowing the transistor 30 to conduct current. The NAND gate 28 will output a high signal thereby allowing the transistor 32 to also conduct current. The RBIAS signal is also high. This allows a current path from the source of the transistor 30 through the RBIAS transistor 34 and memory cell 22 and through the transistor 32.

Referring back to FIG. 1, when the storage element 14 that is used to enable/disable the peripheral module 12 is programmed to disable the peripheral module 12, the corresponding calibration bits 16 that are used to calibrate the peripheral module 12 are no longer required. However, if left unprogrammed, the calibration bits 16 will continue to draw current.

Figure 3A:
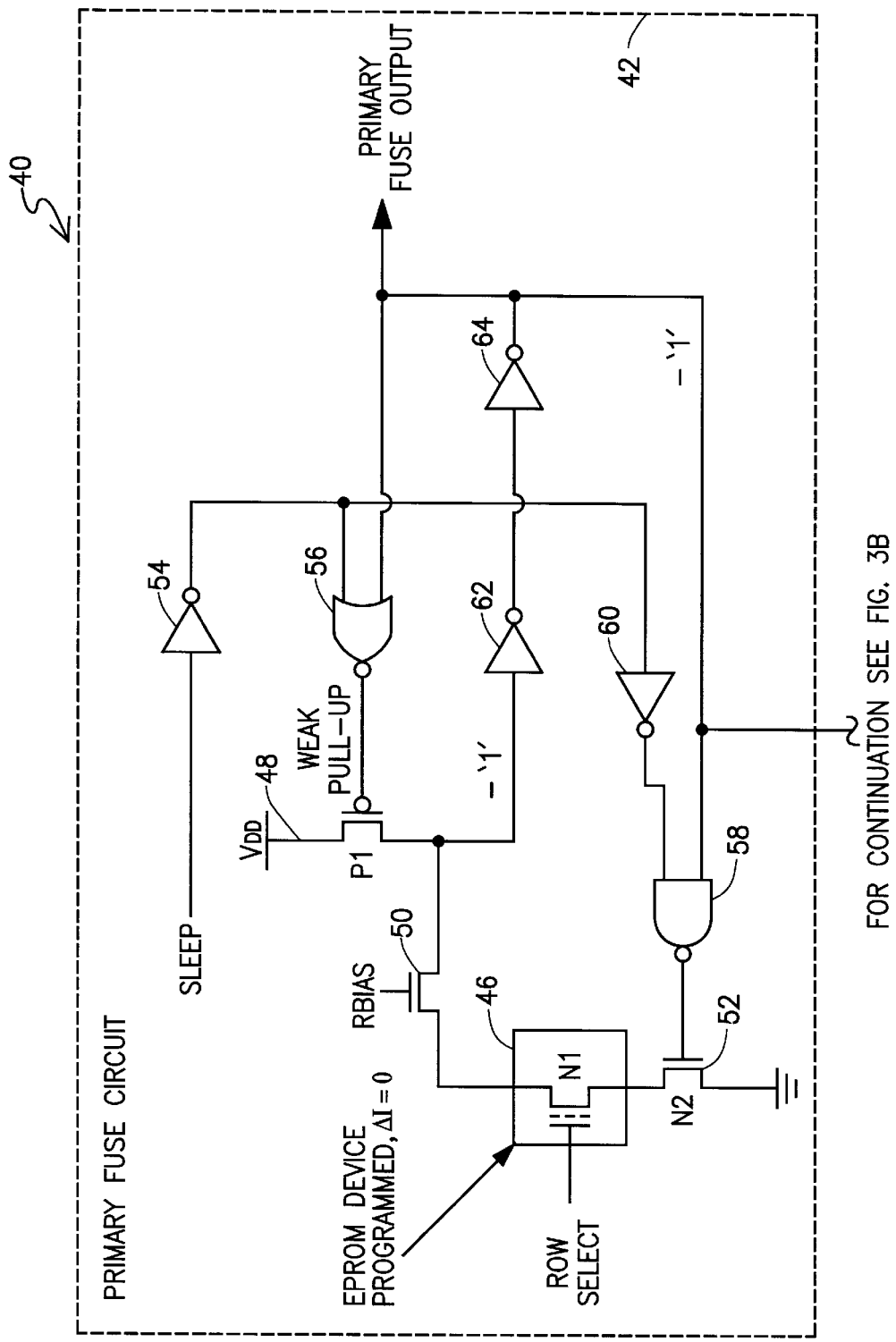
FIG. 3 is a detailed electrical schematic of a circuit for powering down unused configuration fuses when an associated peripheral module is not in use.
Figure 3B:
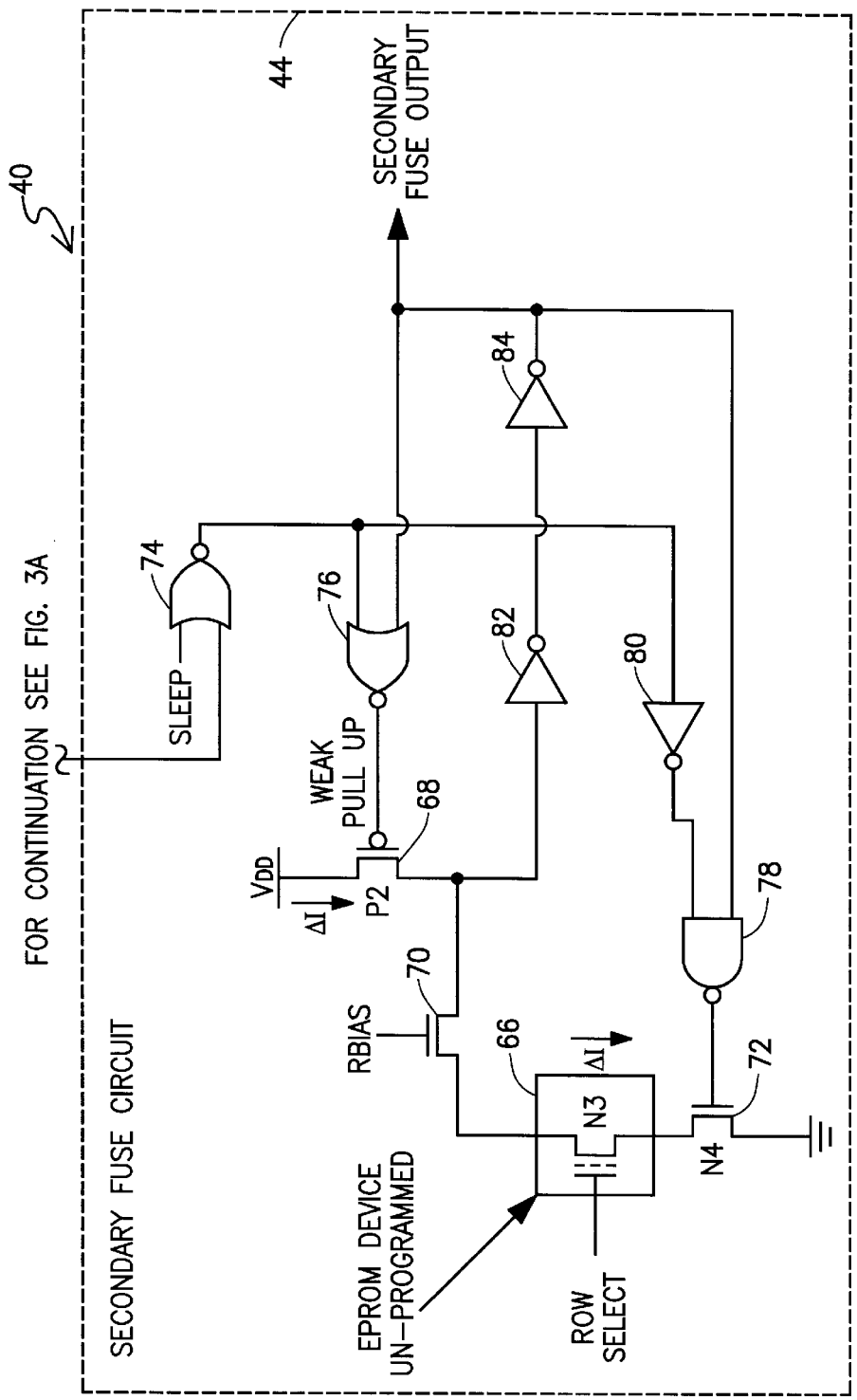

Referring to FIG. 3, a circuit 40 is shown which has a power-down feature to minimize current consumption when the corresponding peripheral module is not in use. The circuit 40 has two main components: a primary fuse circuit 42 and a secondary fuse circuit 44. The primary fuse circuit 42 has an output which is coupled to the peripheral module and to the secondary fuse circuit 44. The primary fuse circuit 42 provides an output signal which is used to enable and disable the peripheral module. The output signal is further used to power down the secondary fuse circuit 44 to minimize current consumption when the peripheral module is disabled.

The primary fuse circuit 42 may be any type of storage element that may enable/disable a peripheral module. In the embodiment depicted in FIG. 3, the primary fuse circuit 42 is similar to the configuration fuse shown and disclosed in FIG. 2. However, it should be noted that the primary fuse circuit 42 is not limited to the embodiment depicted in FIG. 3 and as stated above, the primary fuse circuit 42 may take the form of any type of storage element that may enable/disable a peripheral module. The primary fuse circuit 42 shown in FIG. 3 has a memory cell 46. The memory cell 46 is used to hold the programming state (programmed or unprogrammed) of the primary fuse circuit 42. In the preferred embodiment of the present invention, the memory cell 46 is an EPROM (Electrical Programmable Read Only Memory) memory cell or an EEPROM (Electrical Erasable Programmable Read Only Memory). The memory cell 46 is programmed by a programming current which is generated by a plurality of transistors. A first transistor 48 has a first terminal coupled to a supply voltage $V_{DD}$, a second terminal coupled to control logic, and a third terminal also coupled to the control logic. The first transistor 48 is used to hold the drain of a second transistor 50 at a programmed voltage level when the memory cell 46 is programmed. The second transistor 50 has a first terminal coupled to the third terminal of the first transistor 48, a second terminal coupled to a bias voltage RBIAS, and a third terminal coupled to the memory cell 46. A third transistor 52 is coupled to the memory cell 46 and to the control logic. The third transistor 52 is used as a pull-down device for the memory: cell 46. The third transistor 52 has a first terminal coupled to the memory cell 46, a second terminal coupled to the control logic, and a third terminal coupled to ground. In the embodiment depicted in FIG. 3, the first transistor 48 is a p-channel transistor and the second and third transistors 50 and 52 are both n-channel transistors.

Control logic is coupled to the transistors to control the current flow. The control logic has an inverter 54 coupled to a SLEEP signal. The SLEEP signal is used to power down the primary fuse circuit 42. The output of the inverter 54 is coupled to a first input of a NOR gate 56. A second input of the NOR gate 56 is coupled to the output of the primary fuse circuit 42. The output of the NOR gate 56 is coupled to the second terminal of the first transistor 48 and is used to control (i.e., activate/deactivate) the first transistor 48. A NAND gate 58 has an output coupled to the third transistor 52. The NAND gate is used to control (i.e., activate/deactivate) the third transistor 52. The NAND gate 58 has a first input coupled to the output of a second inverter 60 and a second input coupled to the output of the primary fuse circuit 42. The input of the second inverter 60 is coupled to the output of the first inverter 54. The control logic further has a third and fourth inverter 62 and 64 respectively. The third inverter 62 has an input coupled to the third terminal of the first transistor 48 and an output coupled to the input of the fourth inverter 64. The output of the fourth inverter 64 is coupled to the output of the primary fuse circuit 42.

The secondary fuse circuit 44 is similar to the primary fuse circuit 42. The secondary fuse circuit 44 has a memory cell 66. The memory cell 66 is used to hold the programming state (programmed or unprogrammed) of the secondary fuse circuit 44. In the preferred embodiment of the present invention, the memory cell 66 is an EPROM (Electrical Programmable Read Only Memory) memory cell. The memory cell 66 is programmed by a programming current which is generated by a plurality of transistors. A first transistor 68 has a first terminal coupled to a supply voltage $V_{DD}$, a second terminal coupled to control logic, and a third terminal also coupled to the control logic. The first transistor 68 is used to hold the drain of a second transistor 70 at a programmed voltage level when the memory cell 66 is programmed. The second transistor 70 has a first terminal coupled to the third terminal of the first transistor 68, a second terminal coupled to a bias voltage RBIAS, and a third terminal coupled to the memory cell 66. A third transistor 72 is coupled to the memory cell 66 and to the control logic. The third transistor 72 is used as a pull-down device for the memory cell 66. The third transistor 72 has a first terminal coupled to the memory cell 66, a second terminal coupled to the control logic, and a third terminal coupled to ground. In the embodiment depicted in FIG. 3, the first transistor 68 is a p-channel transistor and the second and third transistors 70 and 72 are both n-channel transistors.

Control logic is coupled to the transistors of the secondary fuse circuit 44 to control the current flow. The control logic has a NOR gate 74 having a first input coupled to a SLEEP signal and a second input coupled to the output of the primary fuse circuit 42. The SLEEP signal is used to power down the secondary fuse circuit 44. The output of the NOR gate 74 is coupled to a first input of a second NOR gate 76. A second input of the NOR gate 76 is coupled to the output of the secondary fuse circuit 44. The output of the NOR gate 76 is coupled to the second terminal of the first transistor 68 and is used to control (i.e., activate/deactivate) the first transistor 68. A NAND gate 78 has an output coupled to the third transistor 72. The NAND gate 78 is used to control (i.e., activate/deactivate) the third transistor 72. The NAND gate 78 has a first input coupled to the output of a second inverter 80 and a second input coupled to the output of the secondary fuse: circuit 44. The input of the second inverter 80 is coupled to the output of the NOR gate 74. The control logic for the secondary fuse circuit 44 further has a third and fourth inverter 82 and 84 respectively. The third inverter 82 has an input coupled to the third terminal of the first transistor 68 and an output coupled to the input of the fourth inverter 84. The output of the fourth inverter 84 is coupled to the output of the secondary fuse circuit 44.

OPERATION

When the primary fuse circuit 42 is programmed to disable the peripheral module, the secondary fuse circuit 44 needs to be powered down (without having to program the secondary fuse circuit 44) so as to not draw any current. Powering down of the secondary fuse circuit 44 is achieved by enabling the output of the primary fuse circuit 42 to turn off either the transistor 68 that is designed to hold up the drain of the transistor 70 when the secondary fuse circuit 44 is programmed or the pull down transistor 72. When the primary fuse circuit 42 is programmed, the output of the primary fuse circuit 42 will drive an input of the NOR gate 74 and will cause the output of the NOR gate 74 to be a "0". When the secondary fuse circuit 44 needs to be powered down, either the transistor 68 or the transistor 72 will be turned off so that no current will flow. The transistor that will be turned off will be dependent on the last value of the secondary fuse circuit 44. For example, with the output of the NOR gate 74 at "0", the first input of the NOR gate 76 will be a "0" and the first input to the NAND gate 78 will be a "1". If the last output of the secondary fuse circuit 44 was a "0", then the second input of the NOR gate 76 will be a "0" and the output of the NOR gate 76 will be a "1" thereby disabling the transistor 68 and preventing current from flowing. If the last output of the secondary fuse circuit 44 was a "1", then the second input of the NAND gate 78 will be a "1" and the output of the NAND gate 78 will be a "0" thereby disabling the transistor 72 and preventing current from flowing.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for powering down configuration circuits to minimize power consumption, said method comprising the steps of:

providing a peripheral module with at least one first configuration circuit;

enabling and disabling said peripheral module with a second configuration circuit; and powering down said at least one first configuration circuit with said second configuration circuit by holding a programming state of said second configuration circuit with a second configuration circuit memory cell, providing a programming current to said second configuration circuit memory cell with a second configuration circuit current source coupled to said second configuration circuit memory cell, wherein current flow is substantially prevented when said second configuration circuit memory cell is not programmed, and controlling said second configuration circuit current source with a second configuration circuit control logic coupled to said second configuration circuit current source;

wherein current consumption of said at least one first configuration circuit is minimized when said peripheral module is disabled.

2. The method according to claim 1, wherein said second configuration circuit minimizes current consumption of said at least one first configuration circuit when said peripheral module is disabled and said at least one first configuration circuit is not programmed.

3. The method according to claim 1, wherein said second configuration circuit memory cell is an EPROM (Electrical Programmable Read Only Memory) cell.

4. The method according to claim 1, wherein said second configuration circuit current source comprises:

a first transistor having a first terminal coupled to a supply voltage source, a second terminal coupled to said second configuration circuit control logic, and a third terminal coupled to said second configuration circuit control logic;

a second transistor having a first terminal coupled to said third terminal of said first transistor of said second configuration circuit current source, a second terminal coupled to a bias voltage source, and a third terminal coupled to said second configuration circuit memory cell; and a third transistor having a first terminal coupled to said second configuration circuit memory cell, a second terminal coupled to said second configuration circuit control logic, and a third terminal coupled to ground.

5. The method according to claim 4, wherein said first transistor of said second configuration circuit current source is a p-channel transistor.

6. The method according to claim 4, wherein said second transistor and said third transistor of said second configuration circuit current source are both n-channel transistors.

7. The method according to claim 1, wherein said second configuration circuit control logic comprises:

a first logic gate having an output coupled to said first transistor of said second configuration circuit current source, a first input coupled to an inverted signal for powering down said second configuration circuit, and a second input coupled to an output of said second configuration circuit; and a second logic gate having an output coupled to said third transistor of said second configuration circuit current source, a first input coupled to a signal for powering down said second configuration circuit, and a second input coupled to said output of said second configuration circuit.

8. The method according to claim 7, wherein said first logic gate of said second configuration circuit control logic is a NOR gate.

9. The method according to claim 7, wherein said second logic gate of said second configuration circuit control logic is a NAND gate.

10. The method according to claim 7, further comprising the steps of:

providing a first inverter having an input coupled to said signal for powering down said second configuration circuit and an output coupled to said first input of said first logic gate of said second configuration circuit control logic; and providing a second inverter having an input coupled to said output of said first inverter of said second configuration circuit control logic and an output coupled to said first input of said second logic gate of said second configuration circuit control logic.

11. The method according to claim 10, further comprising the steps of:

providing a third inverter having an input coupled to said third terminal of said first transistor of said second configuration circuit current source; and providing a fourth inverter having an input coupled to an output of said third inverter of said second configuration circuit control logic and an output coupled to said output of said second configuration circuit.

12. A method for powering down configuration circuits to minimize power consumption, said method comprising the steps of:

configuring a peripheral module with at least one first configuration circuit; and providing a storage element coupled to said peripheral module and to said at least one first configuration circuit;

enabling and disabling said peripheral module with said storage element; and powering down said at least one first configuration circuit by holding a programming state of said first configuration circuit in a first configuration circuit memory cell;

providing a programming current to said first configuration circuit memory cell with a first configuration circuit current source coupled to said first configuration circuit memory cell, wherein current flow is substantially prevented when said first configuration circuit memory cell is not programmed; and controlling said first configuration circuit current source with a first configuration circuit control logic coupled to said first configuration circuit current source;

wherein current consumption of said at least one first configuration circuit is minimized when said peripheral module is disabled.

13. The method according to claim 12, wherein said first configuration circuit memory cell is an EPROM (Electrical Programmable Read Only Memory) cell.

14. The method according to claim 12, wherein said first configuration circuit current source comprises:

a first transistor having a first terminal coupled to a supply voltage source, a second terminal coupled to said first configuration circuit control logic, and a third terminal coupled to said first configuration circuit control logic;

a second transistor having a first terminal coupled to said third terminal of said first transistor of said first configuration circuit current source, a second terminal coupled to a bias voltage source, and a third terminal coupled to said first configuration circuit memory cell; and a third transistor having a first terminal coupled to said first configuration circuit memory cell, a second terminal coupled to said first configuration circuit control logic, and a third terminal coupled to ground.

15. The method according to claim 14, wherein said first transistor of said first configuration circuit current source is a p-channel transistor.

16. The method according to claim 14, wherein said second transistor and said third transistor of said first configuration circuit current source are both n-channel transistors.

17. The method according to claim 14, wherein said first configuration circuit control logic comprises:

a first logic gate having a first input coupled to a signal for powering down said first configuration circuit, and a second input coupled to an output of said storage element;

a second logic gate having an output coupled to said first transistor of said first configuration circuit current source, a first input coupled to an output of said first logic gate of said first configuration circuit control logic, and a second input coupled to an output of said first configuration circuit; and a third logic gate having an output coupled to said third transistor of said first configuration circuit current source, a first input coupled to an inverted output signal of said first logic gate of said first configuration circuit control logic, and a second input coupled to said output of said first configuration circuit.

18. The method according to claim 17, wherein said first logic gate and said second logic gate of said first configuration circuit control logic are both NOR gates.

19. The method according to claim 17, wherein said third logic gate of said first configuration circuit control logic is a NAND gate.

20. The method according to claim 17, further comprising the step of providing a first inverter having input coupled to said output signal of said first logic gate of said first configuration circuit control logic and an output coupled to said first input of said first logic gate of said first configuration circuit control logic.

21. The method according to claim 20, wherein said at least one first configuration circuit control logic further comprises:

a second inverter having an input coupled to said third terminal of said first store of said first configuration circuit current source; and a third inverter having an input coupled to an output of said second inverter of said first configuration circuit control logic and an output coupled to said output of said configuration circuit.

* * * * *